United States Patent [19]

Akamatsu

[11] 4,189,651

[45] Feb. 19, 1980

[54] TRANSISTOR SWITCH DEVICE

[75] Inventor: Masahiko Akamatsu, Amagasaki, Japan

[73] Assignee: Mitsubishi Denki Kabushiki Kaisha, Tokyo, Japan

[21] Appl. No.: 831,005

[22] Filed: Sep. 6, 1977

Related U.S. Application Data

[63] Continuation of Ser. No. 695,029, Jun. 11, 1976, abandoned.

[30] Foreign Application Priority Data

Jun. 20, 1975 [JP] Japan .................................. 50/76008
Jun. 20, 1975 [JP] Japan .................................. 50/76009

[51] Int. Cl.² .................... H03K 17/02; H03K 17/60
[52] U.S. Cl. .................................. 307/254; 307/273; 307/315
[58] Field of Search ............... 307/253, 254, 273, 300, 307/315

[56] References Cited

U.S. PATENT DOCUMENTS

| | | | |
|---|---|---|---|
| 3,368,139 | 2/1968 | Wuerflein | 307/318 X |
| 3,588,851 | 6/1971 | Jordan, Jr. | 307/254 X |
| 3,602,801 | 8/1971 | Williamson | 307/234 X |
| 3,612,909 | 10/1971 | Imabayashi | 307/254 X |

*Primary Examiner*—John Zazworsky
*Attorney, Agent, or Firm*—Oblon, Fisher, Spivak, McClelland & Maier

[57] ABSTRACT

A transistor switch device includes a main power transistor, an auxiliary solid-state switch, and an electricity replenishing means, wherein the electricity replenishing means is connected to the auxiliary solid-state switch which is connected between the collector and the base of the main power transistor so that the voltage drop at the collector of the main power transistor is reduced.

10 Claims, 36 Drawing Figures

$V_{d4} = V_{d3} - V_{CE1}$

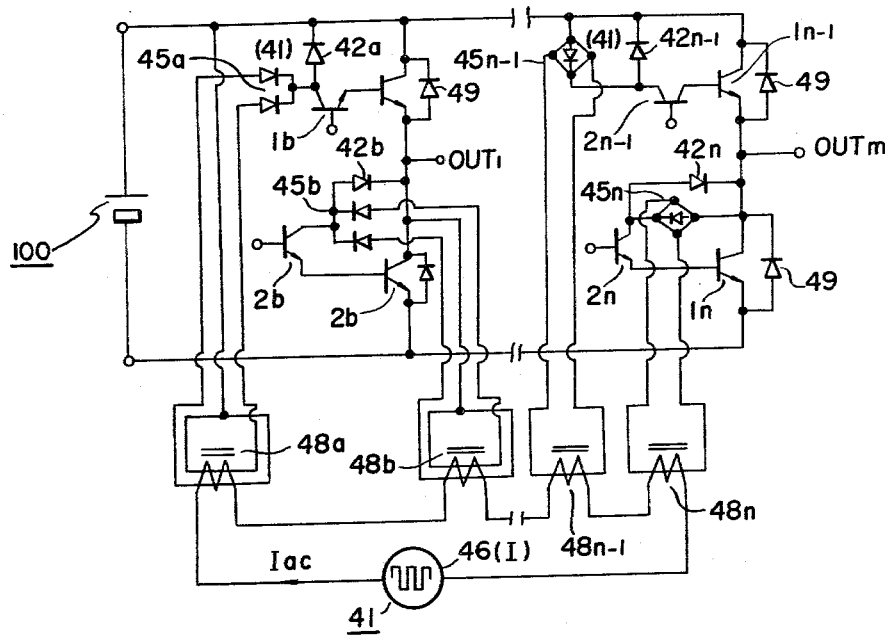

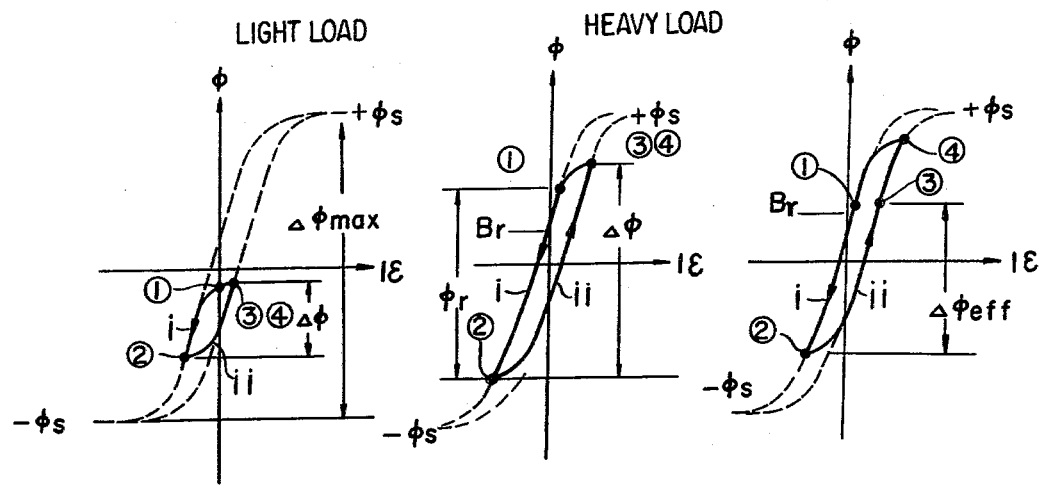
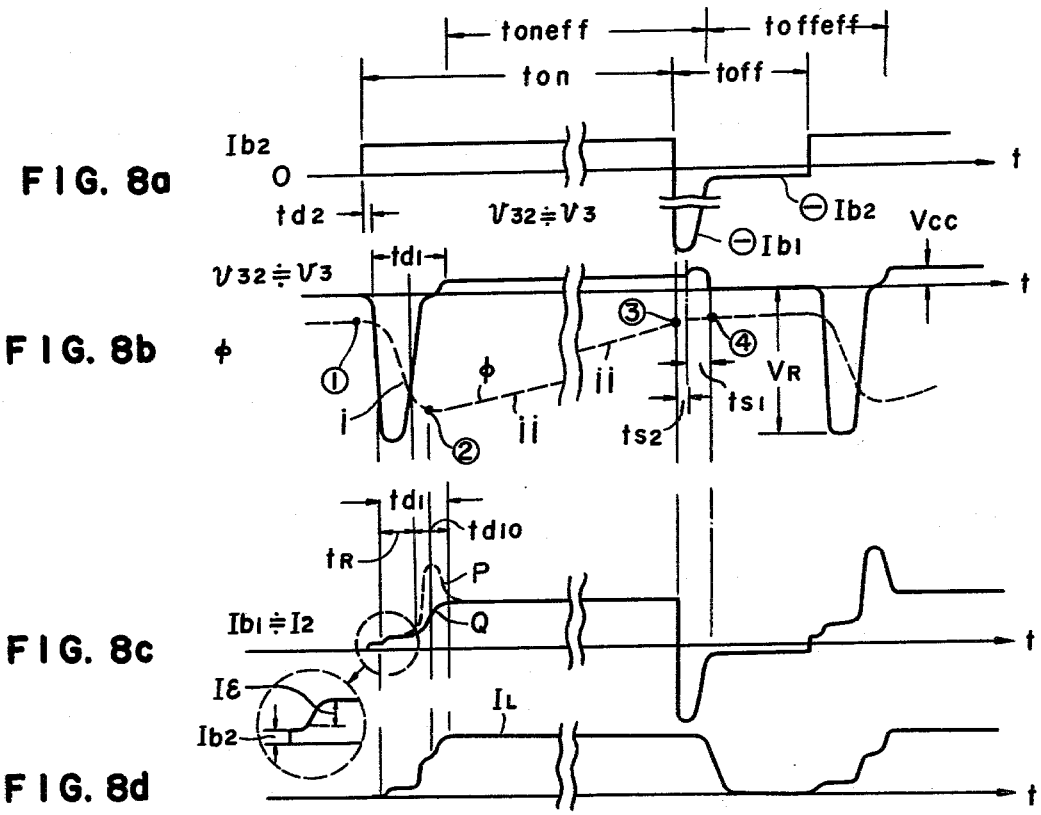

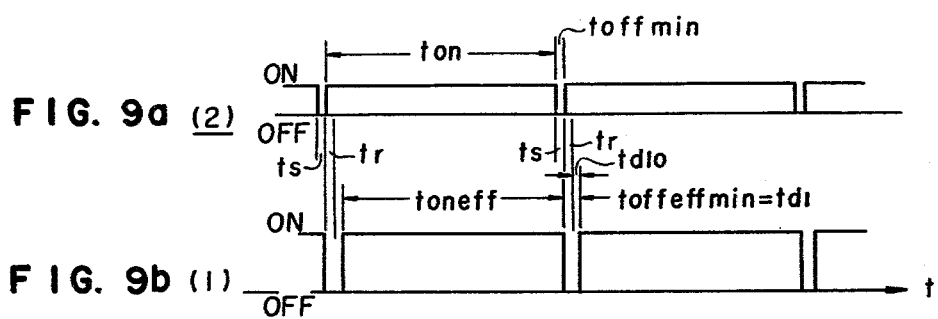
FIG. 9a (2)
FIG. 9b (1)
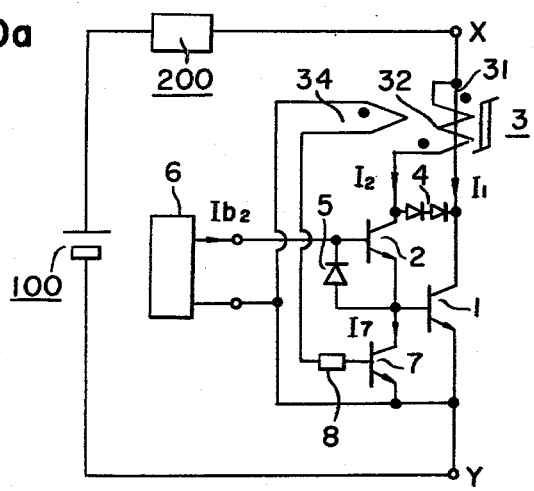
FIG. 10a
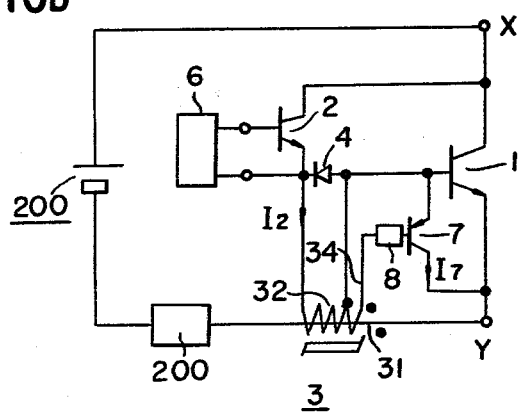
FIG. 10b

FIG. 11e
FIG. 12a (2) 
FIG. 12b (7)
FIG. 12c (1) 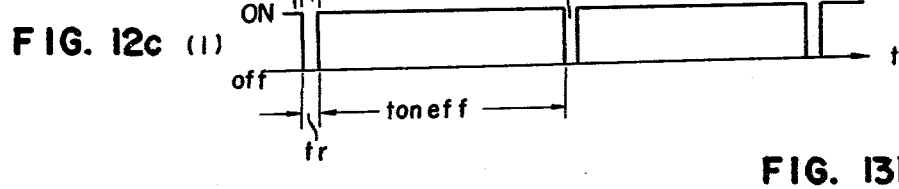
FIG. 13a
FIG. 13b
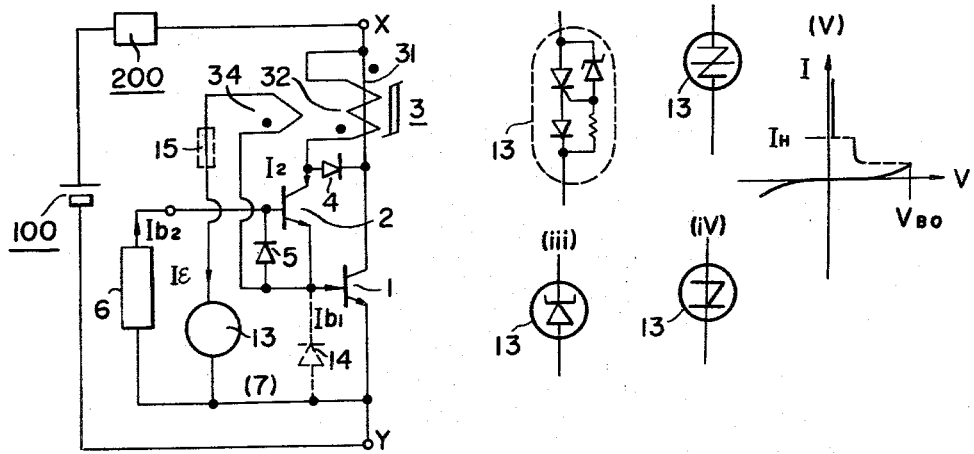

F I G. 18a
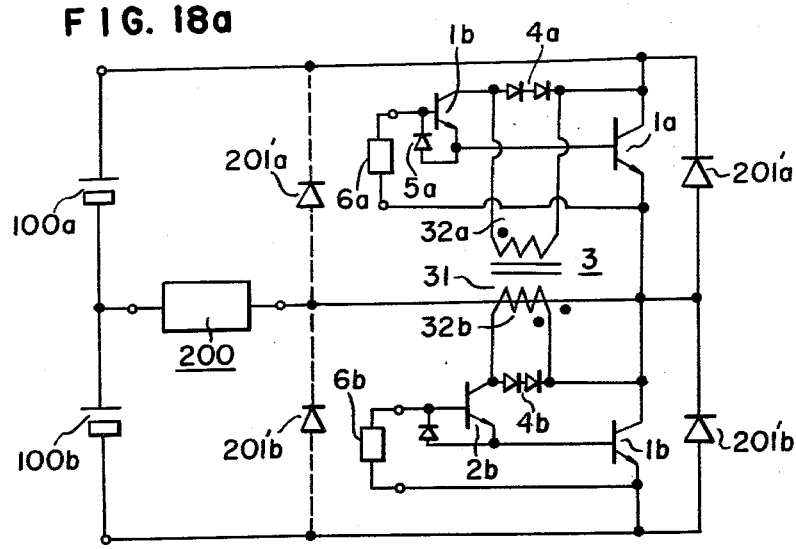
F I G. 18b
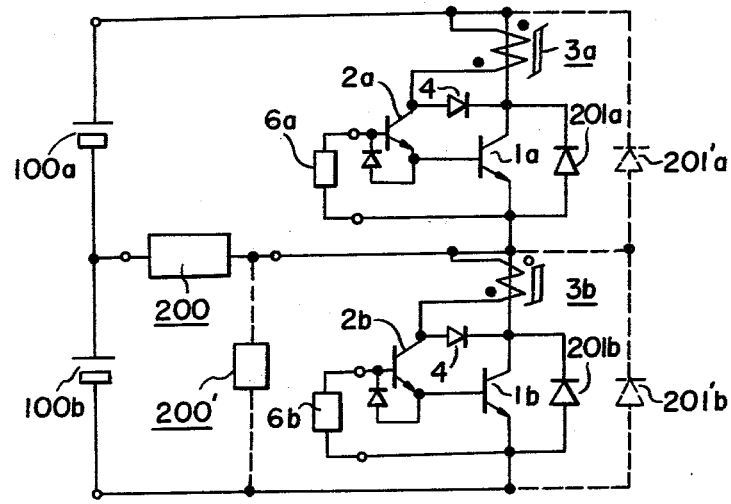

TRANSISTOR SWITCH DEVICE

CROSS-REFERENCE TO RELATED INVENTIONS

This application is a continuation of Application Ser. No. 695,029, filed on June 11, 1976, now abandoned.

BACKGROUND OF THE INVENTION

1. Field of the Invention

The present invention relates to a transistor switch device capable of operation with a reduced voltage drop at the collector of the main power transistor.

2. Description of the Prior Art

High-power transistors, in comparison with thyristors, have a self turn-off function but cause a high collector voltage drop in the high-voltage element during conduction, resulting in a large loss. In a Darlington transistor circuit, the loss is especially large, amounting to two to three times that in a thyristor circuit. In applications where large power is controlled or converted, the Darlington transistor circuit has been considered impracticable in view of its need for considerable cooling and its low current utilizing efficiency.

With respect to FIGS. 1(a) and 1(b), there are shown circuit diagrams of prior art power transistor switch devices. FIG. 1(a) shows a conventional Darlington circuit, comprising power sources 100a and 100b, a load 200, main power transistors 1a and 1b, and auxiliary transistors 2a and 2b connected between the collectors and the bases, respectively, of the main power transistors 1a and 1b. In this Darlington circuit, the necessary collector-emitter voltage $V_{CE2}$ (ON) of the auxiliary transistor 2 in the ON state is supplied from the collector-base voltage $V_{CB1}$ (ON) of the main transistor 1 in the ON state and hence the collector-emitter voltage $V_{CE1}$ (ON) of the main transistor 1 in the ON state becomes large causing the collector loss to be increased during power supply. This has lowered the current utilizing efficiency and made cooling difficult. For these reasons, the Darlington transistor circuit as in FIG. 1(a) is not practical for use as a large-capacity power switch device.

FIG. 1(b) shows another power transistor switch device in which the voltage drop at the collector of the main transistor 1 in the ON state as well as loss can be reduced. However, a rather large amount of power is required from power sources $B_1$ and $B_2$ to drive the bases thereof. The power can be reduced but at the sacrifice of greater collector voltage drop and loss in the main power transistor 1.

SUMMARY OF THE INVENTION

An object of the invention is to provide a transistor switch device comprising an electricity replenishing means connected to the auxiliary solid-state switch in order to reduce the voltage drop in the main transistor and to save the necessary capacity of the base drive power source.

Another object of the invention is to provide a transistor switch device in which the base drive power for the main transistor is self-sufficiently replenished.

The foregoing and other objects are attained in accordance with one aspect of the present invention through the provision of a transistor switch device comprising a main power transistor having a collector, a base and an emitter, an auxiliary solid-state switch, electricity replenishing means, means connecting the auxiliary solid-state switch between the collector and the base of the main power transistor, means connecting the electricity replenishing means to the solid-state switch whereby the voltage drop at the collector of the main power transistor is reduced.

BRIEF DESCRIPTION OF THE DRAWINGS

Various objects, features and attendant advantages of the present invention will be more fully appreciated as the same becomes better understood from the following detailed description of the present invention when considered in connection with the accompanying drawings, in which:

FIG. 5 is a circuit diagram of a switching device using a plurality of power transistors according to the invention, FIG. 6 is a circuit diagram showing another embodiment of the invention, FIGS. 7(a)–7(c) through 9 are diagrams showing operations of the circuits of FIG. 6, FIGS. 10(a) and 10(b) are circuit diagrams showing other embodiments of the invention, FIGS. 11 and 12 are diagrams showing operations of the circuits of FIG. 10, FIGS. 13(a) and 13(b) are circuit diagrams showing another embodiment of the invention, FIG. 14 is a circuit diagram showing another embodiment of the invention; FIGS. 6 through 14(b) show examples of circuits operable independently from DC power, FIGS. 17(a), 17(b), 18(a), 18(b) and 19 are circuit diagrams showing application examples using the principle of the invention.

DETAILED DESCRIPTION OF THE PREFERRED EMBODIMENTS

Figure 2A:
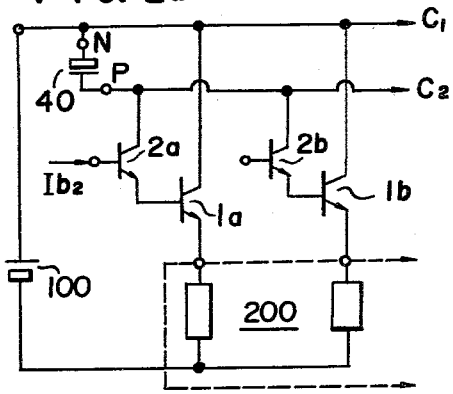
FIG. 2(a) is a circuit diagram showing one embodiment of the invention.

Referring now to the drawings, wherein like reference numerals designate identical or corresponding parts throughout the several views, and more particularly to FIG. 2(a) thereof, there is shown a transistor switch circuit comprising main power transistors 1a and 1b, auxiliary solid-state switches 2a and 2b connected between the collectors and the bases, respectively, of the main power transistors 1a and 1b, and a replenishing power source 40 connected in series to the auxiliary solid state switches 2a and 2b. FIG. 2(a) shows an example wherein the replenishing power source 40 is used in common for the two power transistors. The auxiliary solid-state switches 2a and 2b may be of transistor, gate-turn-off thyristor as in FIG. 2(b), thyristor (with an extinction circuit provided separately), or the like. The replenishing power source 40 may only be capable of offering a voltage as low as 0.5 to 2 V. According to the invention, even if the collector-base voltages of the main transistors 1a and b are low, that is, the collector-emitter voltages thereof are low, the voltage drops in the auxiliary solid-state switches 2a and 2b (hereinafter briefly, auxiliary transistors) while they are in the ON state are replenished with the voltage from the power source 40. As a result, the necessary collector potential of the auxiliary transistor 2 is duly maintained, and the current amplification factor $hfe_2$ remains sufficiently high. This serves to suppress the voltage drop in the main transistor 1.

Figure 3A:
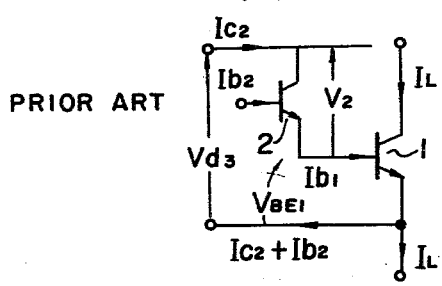
FIG. 3(a) is an equivalent circuit diagram of FIG. 1(b) and FIG. 3(b) is an equivalent circuit diagram of FIG. 2(a), FIGS. 4(a) through 4(c) are circuit diagrams showing electricity replenishing means embodying the invention.

This operation will be described more specifically by referring to FIG. 3. FIG. 3(a) is an equivalent circuit diagram of the prior art circuit as in FIG. 1(b). In FIG. 3(a), the reference $Vd_3$ denotes the minimum voltage required of the base drive power sources 3a and 3b. The voltage $Vd_3$ is the sum of the base-emitter voltage $V_{BE1}$ of the main transistor 1 and the collector-emitter voltage drop $V_2$ of the auxiliary transistor 2, or $Vd_3=(V_{BE1}+V_2)$.

In the circuit of the invention as in FIG. 2(a), the voltage $Vd_4$ of the replenishing power source 40 is lower than the collector potential (i.e., $Vd_3$) of the auxiliary transistor 2 by $V_{CE1}$ which is the collector-emitter voltage of the main transistor 1. That is, $Vd_4=(Vd_3-V_{CE1})=(V_{BE1}+V_2-V_{CE1})$. In other words, under the application of the same base-drive voltage, the voltage $V_2$ of the auxiliary transistor 2 can be maintained high and its current amplification factor can be increased, with the result that the collector voltage drop $V_{CE1}$ of the main transistor is reduced and the loss is reduced accordingly. Under the application of the same base-drive current $Ib_1$ (the same base-drive power source current) and with the same collector voltage drop $V_{CE1}$ of the main transistor, the necessary base-drive power source voltage $Vd_4$ is lowered by $V_{CE1}$, permitting the necessary capacity of the base-drive power source to be reduced. It is apparent that the collector voltage drop $V_{CE1}$ is lowered for the same base-drive power source capacity. Thus, according to the invention, the voltage drop and the collector loss in the main transistor are reduced to make cooling easy. For the same loss, greater current is allowed to flow in the circuit. Furthermore, because the current amplification factor $hfe_2$ of the auxiliary transistor can be maintained high, the external turn-on base current $Ib_2$ may be made small.

Figure 2C:
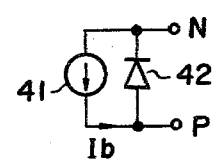
FIGS. 2(b) and 2(c) are diagrams of circuit components embodying the invention.
Figure 3B:
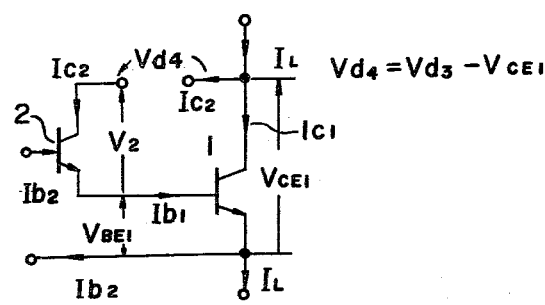
Figure 11A:
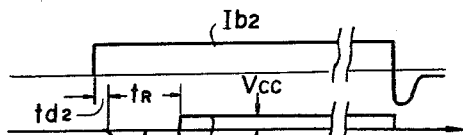
Figure 11B:
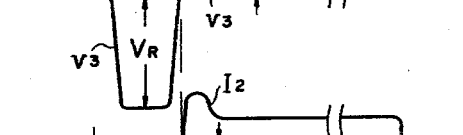
Figure 11C:
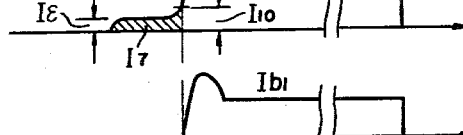
Figure 11D:
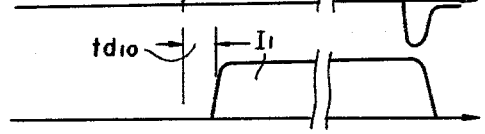

Furthermore, as in FIG. 3, the main current $I_L=Ic_1+Ic_2$. That is, the collector-emitter current $Ic_2$ is branched to the main transistors. In other words, the current $Ic_2$ passes through the main power path and sustains the power path current, enabling the current capacity of the auxiliary transistor to be effectively utilized in sharing the load current. The replenishing power source 40 of FIG. 2(a) may be of a DC power source such as a battery or other DC source provided by the use of a rectifier or chopper. The replenishing power source used in the circuit as in FIG. 2(c) is the combination of a current source 41 and a diode 42. (The diode 42 is used also as a branch means when the auxiliary transistor switch is cut off.) The replenishing power source 40 and its current source 41 will be described below in more detail.

FIGS. 4(a) to 4(c) show examples of replenishing power source 40.

In FIG. 4(a), the DC replenishing power source 40 having a drooping characteristic (current limiting characteristic) is obtained from an AC power source 43 by way of an AC impedance 44 and a rectifier 45. Having a current limiting characteristic, the DC replenishing power source 40 operates half as the current source 41. When the impedance 44 is of reactance X, the loss will be small.

In FIG. 4(b), the DC replenishing power sources 40a to 40n are obtained from a high frequency AC power source 46 by way of a transformer 47 and rectifiers 45a to 45n. In this example, a current source 41 is obtained by the use of a current limiting transformer such as a leakage transformer in place of the transformer 47.

FIG. 4(c) shows an example wherein the replenishing power source (current source 41) 40 is obtained from an m-phase AC power source 43 through rectifiers 45a to 45n by way of current transformers 48a to 48n and an impedance Z. The impedance Z may be of a power network from which power is supplied to the main power transistor circuits such as, for example, the input circuit of the commercial AC power source used as the AC source 43 or may be provided separately.

Thus, according to the invention, the replenishing power is distributed by way of a transformer whereby the necessary capacity of the drive power souce is reduced and the size of the transformer which occupies a considerable area of the base drive circuit is reduced.

Figure 2B:
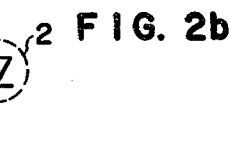

The current source systems shown in FIGS. 2(b), 2(c) and 4 are advantageous for the following reasons. When the replenishing source voltage $Vd_4$ is too high and the impedance is low, the shunt current to the side of the auxiliary solid-state switch is likely to become too large. However, a current source system having a drooping and current limiting characteristic does not give rise to such a problem. At the same time, influence from variations in the voltage drop $V_2$ in the auxiliary solid-state switch is largely diminished. Furthermore, the circuit of the invention operates at a minimum of drive voltage $Vd_4$ at all times for individual operating states, permitting the necessary power to remain at a minimum. This makes it possible to reduce the size of the transformer to a minimum. Still further, the circuit as shown in FIG. 2(a) operates like a known Darlington circuit even without the replenishing voltage $Vd_4$ if the period for which the replenishing voltage is absent (ripple or dip) is short enough or the ratio of the period for which the replenishing voltage is absent or too low to the entire operating period is small enough. This means that the need for smoothing the replenishing power source (base drive power source) is obviated or the smoother used is simplified. Also, for a short overcurrent load, the collector voltage $V_{CE1}$ of the main power transistor rises to initiate the function of the self-sufficient power supply. Hence, a shortage of the replenishing power does not immediately cause an abrupt rise in the collector voltage of the main power transistor and possible resultant breakdown.

FIG. 5 shows another embodiment of the invention wherein a plurality of pairs of bidirectional conductive power control converter units (a plurality of pairs of half-bridge circuits) are used to realize a method for replenishing a plurality of power transistors with power. This embodiment can be applied to inverters, DC power control, time-ratio modulation power amplifiers and the like.

In FIG. 5, the reference numeral 46 denotes a high frequency AC current source, and 48 a current transformer. Because the necessary power supply voltage may be low at a high frequency, the number of the secondary windings of the transformer can be made as small as one turn (through-winding) to several turns. On the side of primary winding, it is desirable that the voltage be made high and the current be made low because this approach facilitates forming the high frequency current source. (This principle does not apply to the instance in which a high frequency current source is set up from a power source whose voltage is as low as ten or several volts.) For this reason, FIG. 5 shows an example wherein the current transformer has more turns of winding on the primary side than on the secondary side. In large power devices, power can be supplied from a group of simple current transformers whose secondary winding is of one to several turns, and hence power distribution through current transformers of a primary series connection type is desirable. In the embodiments as in FIGS. 4(c) and 5, the current or voltage present due to turn-on at the main transistor or a group of main transistors can be used as the input to the transformers 47 or 48.

According to the invention, as described above, an auxiliary solid-state switch is installed between the collector and the base of the main power transistor, and an electricity replenishing means is connected to the auxiliary solid-state switch whereby the collector voltage drop in the main power transistor is reduced. For the same collector voltage drop, a low power source voltage suffices for base drive, permitting the necessary drive power to be reduced.

FIG. 6 is a circuit diagram showing another embodiment of the invention, which comprises a power circuit connecting a power source 100 (an AC power source when one of the directions of an AC circuit is controlled) to a load 200, and a main power transistor 1 connected in series to at least one power path X-Y of the power circuit which is controlled in the on-off mode. An auxiliary solid-state switch 2 is provided between the collector and the base of the power transistor in order to supply base current $I_{b1}$. An electric transformer 3 is provided for deriving electricity (such as voltage, current or power) produced in the power circuit due to the function of the power transistor. The output $v_3$ and $I_2$ of the transformer 3 is supplied to a branch circuit $C_2$—2—$B_1$ of the auxiliary solid-state switch 2. This embodiment exemplifies a single closed-loop power circuit.

In this embodiment, the transformer 3 is a current transformer with its primary winding or primary through-conductor 31 inserted in the power path, and its secondary winding 32 (which includes the primary winding in the case of an autotransformer connection) inserted in series with the solid-state switch branch circuit. The auxiliary solid-state switch 2 is a transistor or thyristor. When the solid-state switch 2 is a transistor, this transistor switch can be used as an electricity replenishing means (as will be described later), which makes it possible to form a Darlington transistor circuit. In such an application, increase in the voltage drop in the main power transistor is obviated. In prior art techniques, the voltage drop in the main power transistor is great even in a two-stage (two subordinate collector common) Darlington circuit, and hence is not suited for large power capacity switch devices. In a three-stage Darlington circuit, the voltage drop in the main power transistor (with capacity greater than 50 A, 200 V) is too high and the resultant loss is too large for practical use. The auxiliary solid-state switch 2 is preferably a gate-turn-off type thyristor. When the ordinary thyristor is used for the auxiliary solid-state switch 2, it is necessary to also provide an extinction means.

In the embodiment using a current transformer as in FIG. 6, the auxiliary solid-state switch 2 is cut off. The shunt means for the secondary current $I_2$ which flows when the solid-state switch 2 is cut off is constituted of rectifier elements and resistors. The shunt means 4 may be connected into the circuit as indicated by 4'. When the shunt means 4 is a rectifier element in the position indicated by the solid line, it is necessary to provide one or a plurality of such rectifier elements connected in series, depending upon the voltage drop in the auxiliary solid-state switch 2 in the ON state. Instead of this rectifier element, a rectifier element whose forward voltage drop is large, or a series of resistors (or nonlinear resistance elements) and a rectifier element may be used. When the rectifier element is in position 4' indicated by the dotted line, it is not necessary to provide a plurality of rectifier elements connected in series to increase the voltage drop in the shunt means.

The rectifier elements 5a and 5b serve as base reverse biasing current paths for turn-off operation, through which the carrier stored in the main transistor 1 or auxiliary solid-state switch 2 is released. The Darlington transistor switch 2 within the frame may be formed of a one-package transistor or a monolithic IC. The numeral 6 denotes an external turn-on control means including the reverse biasing path.

Figure 1A:
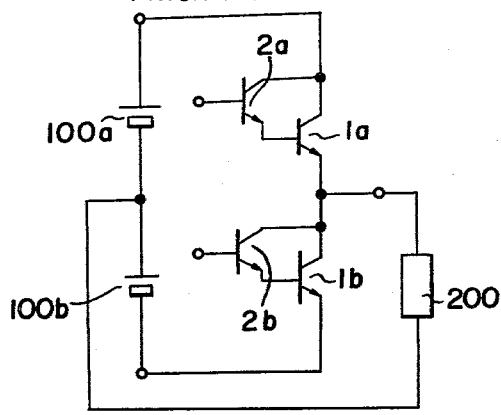
FIGS. 1(a) and 1(b) are circuit diagrams showing prior art power transistor circuits.
Figure 1B:
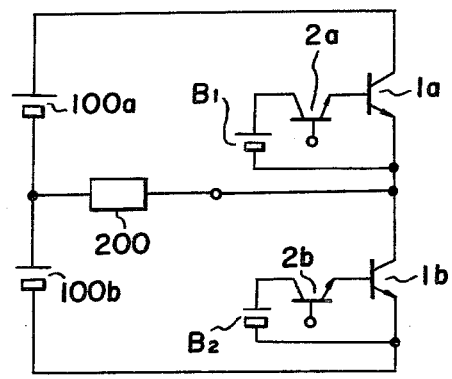

The core 33 of the current transformer 3 may be a ferrite system core or permalloy system core for repetitive high frequency operation or a silicon steel system core for low frequency operation. In a current power network, an ordinary AC current transformer can be used as the transformer 3. The core of the transformer 3 may be in the shape of cut, noncut, lamination, etc. with a multi-leg construction. In the circuit of FIG. 1, the transformer is inserted, together with the power transistor 1, in series with the DC power path X-Y, to make this transformer operate as a repetitive pulse current transformer as will be described below.

In FIG. 7, assume that the initial state ① where the main power transistor 1 and the auxilairy solid-state switch 2 are ON is at the point ① on the core B-H curve (represented by the exciting current I and the number of interlinking fluxes $\phi$) as shown in (a). This initial point corresponds to the timing ① on the operating waveform shown in FIG. 8.

When a turn-on signal $I_{b2}$ as in FIG. 8(a) is applied to the auxiliary solid-state switch 2, the switch 2 turns on after a delay $td_2$. The turn-on of the main power transistor 1, i.e., the presence of the full load current $I_L$ at the main power transistor 1, is delayed beyond the delay $td_2$, to allow the voltage on the power path X-Y to be sustained. The turn-on delay time $td_1$ of the main power transistor 1 consists of the flux reset time $t_R$ of the current transformer (or saturable reactor in a generic sense) and the delay $td_{10}$ after the increase of base current $I_{b1}$ as in FIGS. 8(b) and 8(c).

A negative voltage VR is applied to the secondary winding 32 in FIG. 6 (where the dot mark indicates the positive polarity) during the delay period $td_1$ (especially $t_R$), and the core flux falls along the B-H loop as in FIGS. 7(a) (i) and 8(b) (i).

When the main transistor starts turning on before it reaches the negative saturation level, the base current $I_{b1}$ (which is equal to the current $I_2$ of the auxiliary solid-state switch 2) of the main transistor 1 increases along the solid line Q of FIG. 8(c) and thereafter steady current transformer function starts. In this case, the minimum flux level stands at point ② of FIG. 7(a) or point ② of FIG. 8(b).

When the main transistor turns on after it reaches the negative saturation level, the base current $Ib_1$ of the main transistor 1 exhibits a peak as indicated by the dotted line P in FIG. 8(c).

During the turn-on start delay period $td_1$ of the main transistor 1, the flux of the core 33 is reset and thereafter steady current transformer function starts.

In the event of a heavy load, i.e., a large $I_L$, the voltage drop (substantial turn-on) of the main transistor 1 is delayed and the product of the negative voltage of the current transformer and the time for which the negative voltage is sustained, that is, the flux reset value $\phi_r$ as in FIG. 7(b), increases. The greater the load $I_L$, the longer the delay $td_1$, with the result that the core reaches the negative saturation level $-\phi_s$, causing a peak as indicated by the dotted line P in FIG. 8(c).

The voltage drop delay time $td_1$ of the main transistor depends upon the ratio of the excitation current $I_\epsilon$ (indicated by the dotted encircled line in FIG. 8(c) to the secondary winding of the current transformer 3 (FIG. 6), to the power path current $I_L$. The larger the ratio $I_L/I_\epsilon$, the longer the delay $td_1$. Thus, the core flux is reset to the negative saturation level $-\phi_s$.

When the main transistor 1 turns on, the potential difference between the power paths X-Y and $C_1$-Y decreases whereby the winding 31 functions as the primary winding, and the winding 32 as the secondary winding with a main current $I_L$.

The potential $V_{C2}$ at the terminal $C_2$ of the solid-state switch is the sum of the potential $V_{B1}$ at the base $B_1$ of the main transistor 1 and the voltage drop $V_{(C2-E2)}$ in the solid-state switch, and is larger than the collector voltage $V_{(C1-E1)}$ of the main transistor; that is, $V_{(C1-E1)} < V_{C2}$. Therefore, the current transformer voltage $v_3$ is expressed as $$v_3 = V_{C2} - V_{(C1-E1)} = V_{B1} + V_{(C2-E2)} - V_{(C1-E1)} \quad (1)$$

In the prior art Darlington circuit, the transformer 3 is not used and $v_3=0$. As a result, the condition $V_{(C1-E1)} = V_{B1} + V_{(C2-E2)}$ serves as a limiting factor, causing the voltage drop $V_{(C1-E1)}$ in the main transistor to be increased.

However, according to the invention, the transformer voltage $v_3$ is replenished by virtue of the current transformer 3. During this replenishing period ii in FIG. 7, the core flux rises along ii as in FIG. 7(a) and (b), where $v_3=(v_{32}+v_{31})$. For this period, the flux $\phi$ assumes a curve for the positive low voltage period ii as in FIG. 8(b). Then the solid-state switch current $I_2$ is:

$$I_2 = \frac{N_{31}I_1}{N_{32}} - I_\epsilon \approx Ib_1 \quad (2)$$

where $N_{31}$ and $N_{32}$ denote the numbers of turns of the current transformer windings. In FIG. 6, the number of turns $N_{32}$ of the secondary winding includes those of the windings 31 and 32 since this transformer is an autotransformer.

As in FIG. 6, $$I_L = I_1 + I_2 \quad (3)$$

The base current $Ib_1$ of the main transistor 1 is supplied proportional to the collector current $I_1$ of the main transistor. The ratio $N_{32}/N_{31}$ is determined as:

$$\frac{N_{32}}{N_{31}} = hfe(min) \quad (4)$$

wherein hfe(min) denotes the minimum current amplification factor applied for the maximum current in the main transistor.

The time toneff of the steady period ii can be determined to be sufficiently long relative to the flux reset time $t_R$.

The flux level reaches the point ③ in FIGS. 2(a), (b) and 8(b) immediately before the main transistor 1 is turned off. When the reverse bias $-Ib_1$ is supplied, the auxiliary solid-state switch 2 turns off after its delay $ts_2$, causing the base current $Ib_1$ to be shunted to the shunt means 4. Then the main transistor 1 turns off also after its delay $ts_1$. At this turn-off, the reverse bias pulse $-Ib_1$ is supplied from the turn-on control means 6 when necessary. In FIG. 8(a), the reference $-Ib_2$ denotes a steady reverse bias current.

The core flux $\phi$ reaches the point 4 of FIG. 2(a) and (b) when the turn-off of the main transistor is completed. In this operation, the flux curve is nearly as ③ as in FIG. 7 when the shunt means 4 serves as the rectifier element indicated by the solid line in FIG. 6. When the shunt means 4 is a resistor or rectifier element indicated by the dotted line, a high positive voltage is applied to the current transformer 3 during the period $ts_1$ for which the auxiliary solid-state switch 2 is in the OFF state and the main transistor 1 is in the ON state. As a result, the flux becomes more positive as ④ in FIG. 7(i c). If the flux level of ③ is near the positive flux saturation level $+\phi_s$, the period $ts_1$ is reduced.

Then, for the period the main transistor 1 is OFF, the core flux changes toward the excitation current zero line (Y axis), at a velocity depending upon the shunt means 4, 4' or 4R. A series of the above operations is repeated.

In the above operation, the condition $v_3 \leq 0.5$ to 1 V (where $v_3$ is the replenishing voltage) holds as long as the auxiliary solid-state switch 2 is one transistor (not a Darlington connection) or one thyristor. This value of $v_3$ is below the base-emitter voltage drop in the main transistor. When the auxiliary solid-state switch is a Darlington transistor switch, $v_3 \leq 1$ to 2 V. As the voltage $v_3$ becomes higher, the voltage drop in the auxiliary solid-state switch is allowed to be higher and the voltage drop in the main transistor 1 can be lower. This means that the switch device of the invention is operable with a minimum of power loss, ease of cooling, and is applicable to large power capacity devices.

As shown in FIG. 9(a), ON-OFF of the auxiliary solid-state switch is assumed to occur in the operation for the minimum OFF time toffmin. The turn-off delay time $ts$ of the main transistor 1 is included in the substantial ON time toneff. The flux reset time $t_R$ of the current transformer and the turn-on delay time $td_{10}$ of the main transistor are included in the substantial OFF time toffeff. These time relations are shown in FIG. 9(b).

The current transformer operating condition dependent on the worst flux reset is expressed as:

$$\frac{N_{32} \cdot E \cdot t_R}{N_{32} - N_{31}} = v_3(\text{ton} - td_1) \approx v_3 \text{ton} \quad (5)$$

where E stands for the voltage immediately before turn-on of the power path X-Y, and the flux reset voltage is assumed to be $V_R = E$.

Here the number of turns of the secondary winding is equal to that between terminals $C_1$ and $C_2$, as in Eq. (2).

Also the following equation is established.

$$\frac{t_{on}}{t_R} = \frac{E}{v_3} = K \quad (6)$$

That is, the turn-on duration $t_{on}$ is $E/v_3$ times the flux reset time $t_R$. The turn-on duration multiplying factor K can range from 100 to 600 at a power path voltage of 200 to 300 V. Accordingly, when $td_{10} \leq t_R$, the maximum turn-on time ratio $\alpha$ max is:

$$\alpha \text{ max} = \frac{t_{on eff}}{t_{on eff} + t_{off eff}} \geq 0.98 \quad (7)$$

This maximum value is readily feasible.

In the embodiment shown in FIG. 6, as described above, the switch device functions substantially as a DC current transformer in spite of its use of a magnetic current transformer whereby a high turn-on ratio $\alpha$ is maintained. In other words, the device makes DC power control possible. Even for low-frequency AC control, the use of a high-frequency (time-ratio control frequency) current transformer suffices. Hence the size of the transformer can be reduced. For example, the use of a one-turn through type current transformer is sufficient, the size and construction of which may be about the same as a saturable reactor which has hitherto been utilized in suppressing the turn-on di/dt of the thyristor.

Furthermore, a considerable amount of base-drive power for the main power transistor is supplied self-sufficiently from the main power path. At the same time, the device of the invention offers the effect of reducing the loss in the main power transistor. These advantages enhance the usefulness of the device of the invention.

FIGS. 10(a) and 10(b) are circuit diagrams showing other embodiments of the invention, wherein a shunt means 7 is provided for shunting the excitation current $I_\epsilon$ to the base of the main transistor 1 for the flux reset period $t_R$ at the beginning of turn on. This shunt means (transistor) is self-controlled through a tertiary winding 34 which detects the core flux reset voltage. Operating waveforms of the circuits are shown in FIG. 11.

In FIGS. 10(a) and 10(b), when the auxiliary solid-state switch 2 starts turning on, the excitation shunt transistor 7 turns on by the emf of the tertiary winding 34 through an impedance 8, thereby maintaining the main transistor 1 in the OFF state. (The shunt transistor 7 turns on before the main transistor turns on with the turn-on delay $td_1$.) As a result, the excitation current $I_\epsilon$ of the current transformer 3 flows in the shunt transistor 7. The waveforms thereof are indicated by $I_7$ and $I_\epsilon$ in FIG. 11(c).

When the core flux approaches near or reaches the negative saturation level, the tertiary winding voltage decreases to cause the shunt transistor 7 to turn off. Consequently, the current $I_2$ of the auxiliary solid-state switch 2 is supplied to the base of the main transistor 1 whereby the main transistor is turned on, as in FIG. 11(d) and (e). When the main transistor turns on, the tertiary winding is at a slightly negative voltage or a very low voltage and hence it is unlikely for the shunt means 7 to be turned on. The circuit will thereafter operate in the same manner as the one shown in FIG. 6.

FIG. 10(b) shows an example wherein a voltage transformer 3 is installed in a turn-on power path beside the main transistor power path (main transistor branch) X-Y.

In the embodiments shown in FIG. 10, the core flux can securely be reset to about the negative saturation level irrespective of the turn-on delay of the main transistor and irrespective of the ratio of the main current $I_L$ to the core flux current $I_\epsilon$.

FIG. 12 is a diagram showing operation for maximum continuous turn-on in the circuit as in FIG. 10. In FIG. 12(b), the auxiliary solid-state switch 2 is kept turned on continuously. At the same time, the excitation shunt means 7 is turned on for a given time $t_7$ at the maximum ON time $t_{onmax}$. The period $t_7$ is approximately equal to the turn-on delay $td_{10}$ of the main transistor subtracted from the sum of the turn-off delay $ts_1$ of the main transistor and the flux reset time $t_R$, or $t_7 = ts_1 + t_R - td_{10}$. Thus, as in FIG. 12(c), the main transistor repeats ON-OFF at an ON-OFF ratio at which the main transistor can be considered to be substantially in a continued ON state.

In the circuit of FIG. 10, the excitation shunt means 7 can be turned on-off by an external pulse of given width which synchronizes with the turn-on signal $I_{b2}$. In this case, the need for the tertiary winding 34 is obviated.

FIG. 13 shows another embodiment of the invention in connection with improvements in the turn-on initial flux reset method. This circuit comprises a diode or breakover switch 13, which may be a thyristor with anode igniting means, 5-layer semiconductor switch such as SSS, dynistor, PNPN switch, or the like. When the breakover voltage of the breakover switch is higher than the base-emitter reverse peak voltage of the main transistor 1 and hence the voltage (during flux resetting) of the tertiary winding 34 is to be made high, a protective means such as reverse peak protection rectifier element 14, resistor 15, etc. should be provided.

In FIG. 13(a), when the auxiliary solid-state switch 2 is turned on, a negative voltage is applied to the current transformer 3 before the main transistor 1 starts turning on, causing a negative voltage to be induced in the tertiary winding 34, whereby the breakover switch 13 turns on and the auxiliary solid-state switch current $I_2$, i.e., the excitation current $I_\epsilon$, flows in the excitation shunt means 7 which comprises the tertiary winding 34 and the breakover switch 13. During this operation, the base of the main transistor 1 is negatively biased.

When the voltage (negative) of the tertiary winding becomes small at the end of core flux reset, the base potential of the main transistor 1 rises to cause the main transistor to turn on. Thereafter the circuit will operate in the same manner as in FIG. 6. When the breakover switch 13 is an element whose forward voltage drop and holding current IH are large and is capable of being readily turned off (such as having a V-I characteristic as indicated by (v) in FIG. 13(b)), the breakover switch turns off while the main transistor 1 is being turned on. In this manner, this circuit operates as in FIG. 11.

Figure 14A:
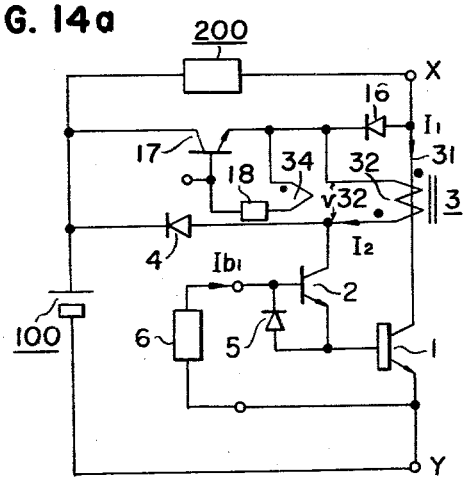

FIG. 14 shows another embodiment of the invention wherein the main transistor 1 is kept turned on continuously and the function of the current transformer 3 is maintained continuously.

Figure 14B:
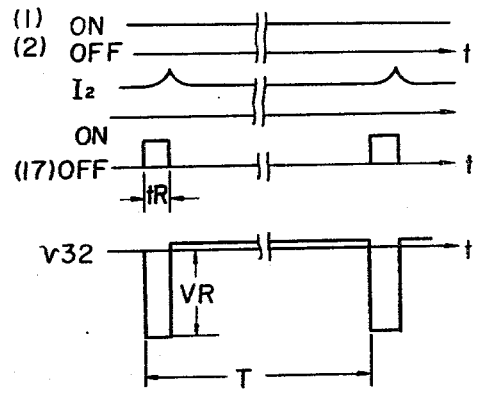

When the auxiliary solid-state switch 2 and the main transistor 1 are continuously in the ON state as in FIG. 14(b), an intermittent flux reset switch 17 is turned on for the period $t_R$ at intervals of time T. In this operation, the period $t_R$ can be controlled automatically under self-control by the tertiary winding 34. Instead of the tertiary winding 34, an external signal may be used to turn on the switch 17 for a given period $t_R$. With self-control, it is desirable that the impedance 18 be a differential element comprising, for example, a parallel resistor-capacitor circuit. During the period $t_R$ for which the flux reset switch 17 is in the ON state, a negative voltage VR is applied to the secondary winding voltage $v_{32}$. During this operation, the diode 16 blocks the voltage VR, thereby preventing it from short-circuiting over the side of the main transistor. In this state, the secondary winding current $I_2$ is larger than the magnetomotive force ($N_{31}.I_1$) of the primary winding current $I_1$ by the excitation current, that is, $$I_2 = \frac{N31}{N32} I_1 - I_\epsilon$$

(where $I_\epsilon$ is the excitation current changing from negative to positive). In other words, the function of the current transformer is maintained in the above state. When the flux reset switch 17 is turned off, the circuit operation shifts to the foregoing steady operation. Thus the secondary winding current $I_2$, i.e., the base current of the main transistor 1, assumes the waveform $I_2$ shown in FIG. 14(b), and the current transformer voltage $v_{32}$ assumes the waveform $v_{32}$.

As described above, the function of the current transformer 3 is steadily maintained while the main transistor is kept turned on continuously. In other words, the invention achieves its aim regarding "perfect turn-on by DC" or makes it possible to realize a 100% turn-on ratio.

It is apparent that the switch circuit of the invention can be effectively utilized within a finite turn-on time. The embodiments shown in FIGS. 1, 10, 13 and 14 are uniquely advantageous in that a means for applying the pulse reset voltage VR is provided and the current transformer function is maintained by a single power transistor circuit by the use of a single core having substantially a full time range. Prior art techniques have failed in offering power transistor switch devices capable of DC operation by the use of a transistor or the like; it has been thought theoretically impracticable. One example known regarding such operation depends upon the use of plural-core AC (alternating) type construction.

Figure 15A:
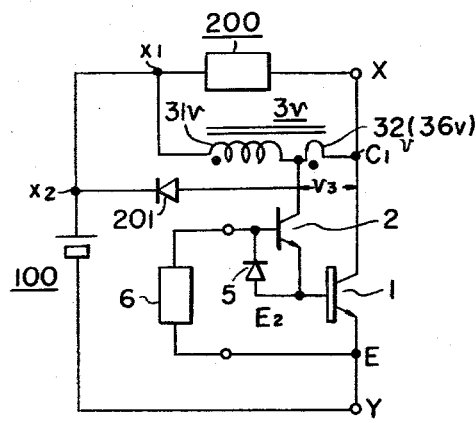
FIGS. 15(a) and 15(b) are circuit diagrams showing other embodiments of the invention.
Figure 15B:
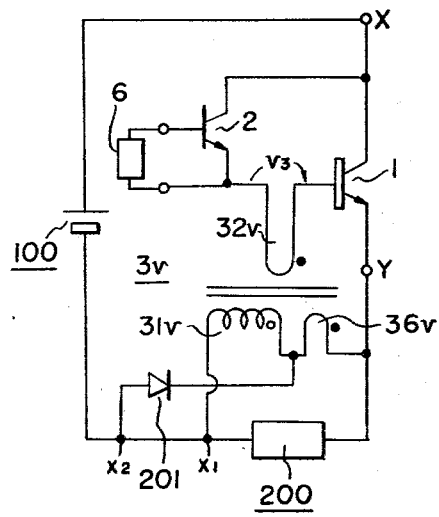

FIGS. 15(a) and 15(b) are diagrams showing other embodiments of the invention wherein the reference $3v$ denotes a voltage transformer, $31v$ and $32v$ the primary and secondary windings respectively, $36v$ a reset winding, and 201 a main current commutating diode (such as a flywheel diode or a feedback rectifier) used while the main transistor is in the OFF state.

In FIG. 15, when the auxiliary solid-state switch 2 is turned on, the main transistor 1 turns on, a voltage is applied to the transformer $3v$, a voltage $v_3$ (whose positive polarity is indicated by the dot (.)) is induced across the secondary winding $32v$, and this voltage is supplied to the auxiliary solid-state switch branch. As a result, the necessary voltage drop in the auxiliary solid-state switch and the base-emitter voltage drop in the main transistor are duly maintained even if the collector voltage drop in the main transistor is insufficient, as in the embodiment shown in FIG. 1. In other words, the collector-emitter voltage drop and consequent power loss in the main transistor are reduced.

When the auxiliary solid-state switch 2 and the main transistor 1 are turned off, a reverse magneto-motive force is developed through the reset winding $36v$ (used in common with the winding $32v$ in FIG. 15(a)) by the current of the main current path, such as by the commutating diode 201, and thus the core flux is reset.

In this voltage transformer system, core flux reset cannot be sufficiently done to make it impossible to operate the circuit over a wide range of turn-on time ratios if the single DC circuit as in FIG. 15 is employed. To solve this problem, it is necessary to use a means (such as a power source) for providing a potential difference between anodes $x_1$ and $x_2$. This corresponds to an AC control as will be described later. Also, a means is provided for allowing a given voltage to be applied to or induced across the primary winding $31v$.

Figure 16:
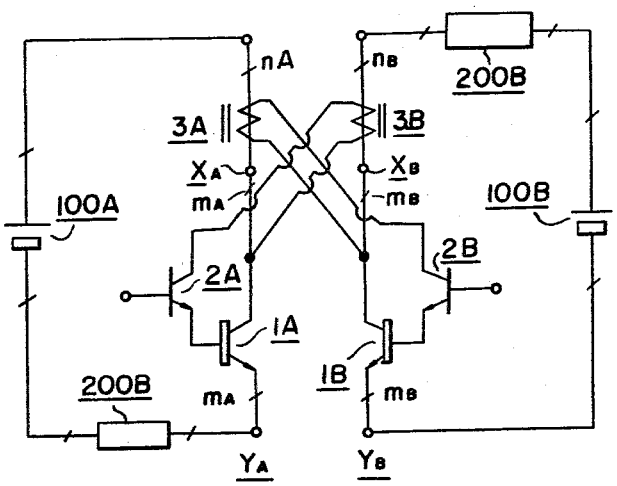
FIG. 16 is a connection diagram showing one embodiment of the invention using a plurality of power transistors.

FIG. 16 is a circuit diagram showing another embodiment of the invention comprising a plurality of main power transistors. This circuit consists essentially of a power network group A and a power network group B, which have a main transistor group 1A comprising mA numbers of main transistors, and a main transistor group 1B comprising mB numbers of main transistors, respectively. They are connected to an XA-YA group of mA numbers of power paths and an XB-YB group of mB numbers of power paths respectively. The switch device further comprises nA numbers of transformers 3A and nB numbers of transformers 3B, and also a plurality of power sources 100A and 100B, and loads 200A and 200B. FIG. 16 is a conceptual diagram showing one group of closed loops comprising main power transistors, power sources and loads. In this arrangement, the power sources and loads are commonly operated in the individual power networks.

The two power networks A and B may be consolidated together into one as shown by simplified diagrams in FIG. 1.

In FIG. 15, assume that the two circuits (a) and (b) are a power closed-loop. Then it becomes possible for the two power loops to supply the base drive current (drive voltage) of the main power transistor on the side opposite to each other. A simple way to effect this operation is to turn on and off the main power transistors 1A and 1B synchronously with each other as in FIG. 16.

Assume that both groups A and B comprise a plurality of closed-loops in which at least one of the transformers is in operation and at least one of the transformer secondary windings connected to one power transistor is in operation. Then this power transistor can be arbitrarily turned on-off and the supply of its base-drive power is secured. In this case, it is not necessary to satisfy the foregoing synchronized turn-on-off condition for the power transistors.

What is important is that at least one of the transformers connected to the main transistor be operated at least for the period when this main transistor is turned on. To meet this requirement, there may be a variety of types of power networks and transformer networks available.

Basic principles and ideas of the invention have been described above. For a better understanding of the invention, several application examples will be described below.

Figure 17A:
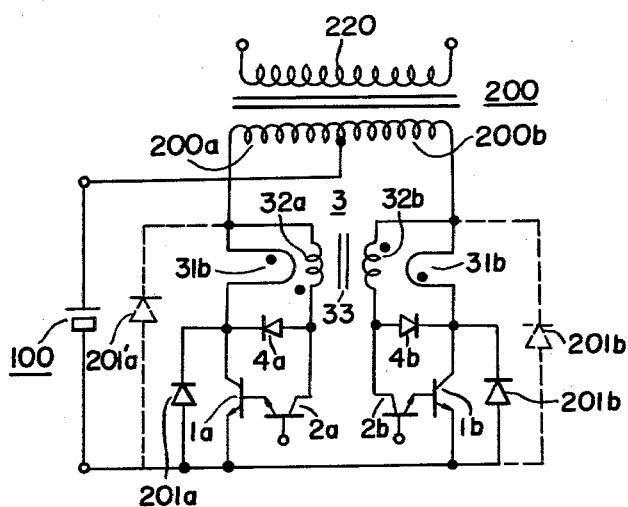
Figure 17B:
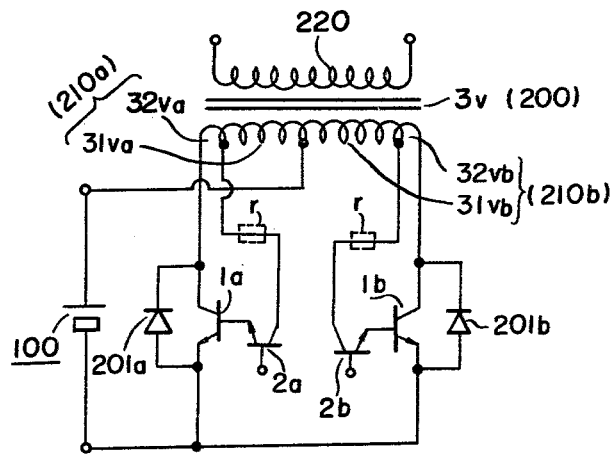

Referring to FIGS. 18(a) and 18(b), there are shown examples of application of the invention to an inverter of the single-way connection type; (a) is a current transformer system, and (b) a voltage transformer system, wherein an output transformer 200 and a voltage transformer 3 are used on common. The voltage transformer 3 has its core used in common for main power transistors 1a and 1b. In the voltage transformer system as in FIG. 18(b), a base-drive current limiting resistor r (with a small resistance) may be used when the tap voltage is too high at the secondary windings 32va and 32vb. The circuit as in FIG. 17 may be applied to various single way connections and multiphase connections.

The circuits shown in FIGS. 18(a) and 18(b) constitute a series-pair connection (half-bridge) used for bidirectional power conversion control or bidirectional conductive power conversion control and are suited for applications to inverters and DC power controls.

The circuit shown in FIG. 18(a) is an example wherein an AC current transformer is employed with its core used in common. This circuit can be used in the voltage transformer system when the number of turns of the primary winding 31 is increased and the primary winding is connected in parallel to the load 200.

The circuit in FIG. 18(b) is an example wherein a current transformer is disposed for each main power transistor. This example is suited for applications to control of a DC load (reversible-polar load 200 or unipolar voltage load 200'), time-ratio modulation type inverters operable in a wide frequency range, etc.

In FIG. 18, the rectifier element 201 may be connected in the position indicated by the dotted line 201'. The circuit in FIG. 18 can be applied to various bridge circuitry.

Figure 19:
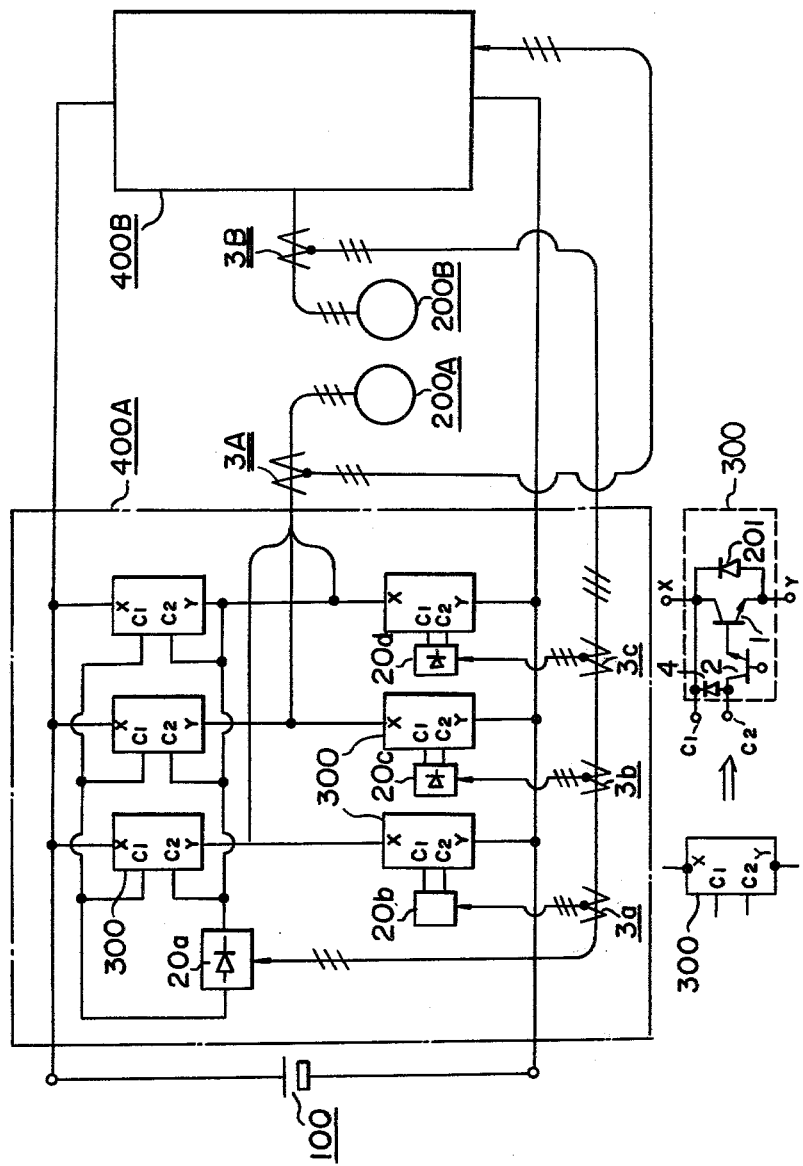

FIG. 19 is a circuit diagram showing a switch circuit embodying the concept of the invention illustrated in FIG. 16. In FIG. 19, the numeral 300 denotes a one unit arm comprising a main transistor 1, a rectifier element 201, an auxiliary solid-state switch 2, and a branch means 4. There are also provided a main current terminal X-Y, and base-drive current supply terminals $C_1$ and $C_2$. The reference 20 indicates a rectifier for a base-drive current supply, and 400A and 400B and bridge type inverter units having a construction similar to each other. The group A inverter unit 400A receives power from a primary current transformer 3B installed in the output current path of the group B inverter unit 400B. This power supply may be generated from a current transformer 3A inserted in its own output current path. The secondary output current of the primary current transformer 3B is supplied commonly through a rectifier 20a to three unit arms of the positive group. The secondary output current of this primary current transformer 3B is connected to the primary windings of the secondary current transformers 3a, 3b and 3c. The secondary outputs of these secondary current transformers are connected to rectifiers 20b, 20c and 20d and are supplied to three unit arms, respectively, of the negative group.

In this case, it is necessary to operate the two groups 400A and 400B simultaneously where the turn-on-off synchronism among power transistors need not be established. This example is advantageous in that the load current is balanced between the two groups A and B.

In this example, a DC voltage transformer or, in particular, a DC current transformer, may be used instead of the above voltage transformer. Also, a DC current transformer operable without generating ripples may be used. Further, a current transformer having a response to a wide frequency range may also be used. With the use of a DC current transformer, the limitation on the turn-on holding time is eliminated.

According to the invention, as has been described with reference to its embodiments illustrated in FIGS. 6 to 19 in connection with the switch device wherein an auxiliary solid-state switch is connected between the collector and the base of a main power transistor whereby the base-drive current is supplied to the main power transistor, the voltage or current in the main power circuit comprising the main power transistor and the other main power transistors is transformed and supplied to the auxiliary solid-state switch branches and thus the voltage drop in the main power transistor in the ON state is reduced, the loss in the main power transistor is diminished, and the base-drive power of the main power transistor is self-sufficiently replenished.

Obviously, numerous modifications and variations of the present invention are possible in light of the above teachings. It is therefore to be understood that within the scope of the appended claims the invention may be practiced otherwise than as specifically described herein.

What is claimed is:
1. A transistor switch device comprising:
   a main power transistor having a collector, a base and an emitter with a voltage drop between the collector and the emitter,
   an auxiliary solid-state switch,
   a series connected branch comprising said auxiliary solid-state switch and an electricity replenishing means, said series connected branch being connected between the collector and the base of the main power transistor, and said electricity replenishing means generating a voltage, and
   shunt means comprising a diode connected in parallel with said electricity replenishing means for bypassing a current of said electricity replenishing means when said auxiliary solid state switch is turned off,
   whereby the voltage drop between the collector and the emitter of the main power transistor is reduced.
2. A transistor switch device according to claim 1 wherein the electricity replenishing means is a DC power source.
3. A transistor switch device according to claim 1 wherein the electricity replenishing means further comprises a rectifier having input and output terminals, an AC power source and an AC transformer having a plurality of primary windings and a plurality of secondary windings,
   the output terminals of the rectifier being serially connected across the series connected branch,
   the input terminals of the rectifier being connected to at least one of the secondary windings of the AC transformer,
   the AC power source being connected to at least one of the primary windings of the AC transformer.
4. A transformer switch device according to claim 1 wherein the electricity replenishing means comprises a high-frequency AC power source whose output is connected to the input of a high-frequency transformer whose output is connected to the input of a rectifier,
   the frequency of the high-frequency AC power source being higher than 100 Herz.
5. A transistor switch device according to claim 1 wherein the auxiliary solid-state switch is an auxiliary transistor.
6. A transistor switch device comprising:
   a main power transistor having a collector, a base and an emitter with a voltage drop between the collector and the emitter,
   an auxiliary solid-state switch, a series connected branch comprising said auxiliary solid state switch and an electricity replenishing means, wherein the electricity replenishing means comprises a transformer capable of deriving electricity from a power circuit in which the main power transistor is disposed, and the transformer is a current transformer having a primary winding connected to the power circuit in which the main power transistor is disposed and a secondary winding connected in said series connected branch, said series connected branch being connected between the collector and the base of the main power transistor, and said electricity replenishing means generating a voltage, whereby the voltage drop between the collector and the emitter of the main power transistor is reduced.

7. A transistor switch device comprising:

a main power transistor having a collector, a base and an emitter with a voltage drop between the collector and the emitter, an auxiliary solid-state switch, a series connected branch comprising said auxiliary solid-state switch and an electricity replenishing means, wherein the electricity replenishing means comprises a transformer capable of deriving electricity from a power circuit in which the main power transistor is disposed, shunt means connected in parallel to the secondary winding of the transformer for shunting the secondary current of the transformer when the auxiliary solid-state switch is turned off, said series connected branch being connected between the collector and the base of the main power transistor, and said electricity replenishing means generating a voltage, whereby the voltage drop between the collector and the emitter of the main power transistor is reduced.

8. A transistor switch device comprising:

a main power transistor having a collector, a base and an emitter with a voltage drop between the collector and the emitter, an auxilary solid-state switch, a series connected branch comprising said auxiliary solid-state switch and an electricity replenishing means, wherein the electricity replenishing means comprises a transformer capable of deriving electricity from a power circuit in which the main power transistor is disposed, shunt means connected between the base and the emitter of the main power transistor to bypass excitation current of the transformer when the auxiliary solid-state switch is turned on, said series connected branch being connected between the collector and the base of the main power transistor, and said electricity replenishing means generating a voltage, whereby the voltage drop between the collector and the emitter of the main power transistor is reduced.

9. A transistor switch device according to claim 8 wherein the shunt means is a tertiary winding of the transformer.

10. A transistor switch device comprising:

a main power transistor having a collector, a base and an emitter with a voltage drop between the collector and the emitter, an auxiliary solid-state switch, a series connected branch comprising said auxiliary solid-state switch and an electricity replenishing means, wherein the electricity replenishing means comprises a transformer capable of deriving electricity from a power circuit in which the main power transistor is disposed, and the transformer is a voltage transformer which derives voltage from the power circuit in which the main power transistor is disposed, the voltage transformer having a primary winding connected to the power circuit and a secondary winding connected in said series connected branch, said series connected branch being connected between the collector and the base of the main power transistor, and said electricity replenishing means generating a voltage, whereby the voltage drop between the collector and the emitter of the main power transistor is reduced.

* * * * *